United States Patent
Chen et al.

(10) Patent No.: US 6,303,509 B1
(45) Date of Patent: Oct. 16, 2001

(54) METHOD TO CALIBRATE THE WAFER TRANSFER FOR OXIDE ETCHER (WITH CLAMP)

(75) Inventors: Ching-Ming Chen, Taipei; Yuh-Da Fan, Miao-Li; Pao-Ling Kuo, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/431,535

(22) Filed: Oct. 29, 1999

(51) Int. Cl.[7] .................................................. H01L 21/302
(52) U.S. Cl. ........................... 438/706; 438/716; 438/723
(58) Field of Search ..................................... 438/706, 716, 438/723, 708, 710; 156/345; 118/503, 728

(56) References Cited

U.S. PATENT DOCUMENTS

| | | | |
|---|---|---|---|
| 4,654,115 | 3/1987 | Egitto et al. | 156/643 |
| 5,534,110 | 7/1996 | Lenz et al. | 156/643.1 |
| 5,742,393 | * 4/1998 | Landau et al. | 356/375 |
| 5,783,482 | 7/1998 | Lee et al. | 438/624 |
| 6,120,601 | * 9/2000 | Landau et al. | 117/98 |
| 6,144,926 | * 11/2000 | Ishizawa et al. | 702/94 |
| 6,166,509 | * 12/2000 | Wyka et al. | 318/640 |

* cited by examiner

Primary Examiner—Robert Kunemund
Assistant Examiner—Duy-Vu Deo
(74) Attorney, Agent, or Firm—George O. Saile; Stephen B. Ackerman; Rosemary L. S. Pike

(57) ABSTRACT

A method for calibrating the wafer transfer system by using an inspection control wafer after plasma etching is described. An inspection control wafer is provided comprising a polysilicon layer overlying an oxide layer on the surface of a semiconductor substrate wherein the polysilicon layer does not cover the oxide layer for a first distance from the edge of the wafer. The inspection control wafer is entered into the wafer transfer system wherein the wafer is transferred to a spin-on-glass etchback chamber wherein the wafer is held by clamps which extend a second distance from the edge of the wafer and wherein there is designed an overlap difference between the first and second distances. The wafer is subjected to a spin-on-glass etchback step and then inspected for damage to the oxide layer. Oxide layer damage occurs if the second distance is less than the first distance by more than the overlap difference. Oxide layer damage indicates the need to recalibrate the wafer transfer system.

20 Claims, 3 Drawing Sheets

METHOD TO CALIBRATE THE WAFER TRANSFER FOR OXIDE ETCHER (WITH CLAMP)

BACKGROUND OF THE INVENTION (1) Field of the Invention

The present invention relates to the fabrication of integrated circuit devices, and more particularly, to a method of preventing oxide peeling by calibrating the wafer transfer using an inspection control wafer after plasma etching in the fabrication of integrated circuit devices.

(2) Description of the Prior Art

During spin-on-glass etchback, the wafer is held at its edge by a clamp. The etching back of the spin-on-glass material produces a polymer which builds up under the edge of the clamp on the wafer surface. This polymer cannot be removed by the conventional plasma treatment. An oxide layer deposited over the wafer after spin-on-glass etchback will cover the polymer buildup. During the subsequent vacuum bake step, this high temperature treatment will cause the polymer buildup to inflate which will cause peeling away of the overlying oxide layer. Additionally, the peeled oxide will contaminate the production tools and the wafer.

U.S. Pat. No. 5,783,482 to S. L. Lee et al, issued on Jul. 21, 1998 discloses a method in which oxide peeling at the edge of a wafer is avoided by removing polymer contaminants from the edge of the wafer. This is achieved by adjusting the via edge exclusion zone of the photoresist mask so that the polymer is exposed and can be removed by the photoresist strip after etching. However, if the wafer transfer system causes the wafer to be shifted at the spin-on-glass etchback step or if the edge exclusion zone is shifted at the via photolithography step, the oxide layer above the persistent polymer cannot be removed by the photoresist strip step and oxide peeling will occur.

SUMMARY OF THE INVENTION

Accordingly, it is a primary object of the invention to provide a reliable and very manufacturable method for preventing oxide peeling at the edge of a wafer.

A further object of the invention is to provide a process for calibrating the wafer transfer system in order to prevent oxide peeling at the edge of a wafer.

Another object is to provide a process in which oxide peeling at the edge of a wafer is avoided by calibrating the wafer transfer system using an inspection control wafer after plasma etching.

Yet another object of the invention is to provide a process to avoid tool and wafer contamination by oxide flaking by assuring that the edge exclusion zone has not shifted at the via photolithography step.

Yet another object is to provide a process in which oxide peeling at the edge of a wafer is avoided by assuring that the wafer transfer system has not shifted at the SOG etchback step and that the edge exclusion zone has not shifted at the via photolithography step.

In accordance with the objects of the invention, a method for calibrating the wafer transfer system by using an inspection control wafer after plasma etching is achieved. An inspection control wafer is provided comprising of polysilicon a semiconductor substrate wherein the polysilicon layer does not cover the oxide layer for a first distance from the edge of the wafer. The inspection control wafer is entered into the wafer transfer system wherein the wafer is transferred to a spin-on-glass etchback chamber wherein the wafer is held by clamps which extend a second distance from the edge of the wafer and wherein there is designed an overlap difference between the first and second distances. The wafer is subjected to a spin-on-glass etchback step and then inspected for damage to the oxide layer. Oxide layer damage occurs if the second distance is less than the first distance by more than the overlap difference. Oxide layer damage indicates the need to recalibrate the wafer transfer system.

BRIEF DESCRIPTION OF THE DRAWINGS

In the accompanying drawings forming a material part of this description, there is shown.

DESCRIPTION OF THE PREFERRED EMBODIMENTS

The process of U.S. Pat. No. 5,783,482 to avoid oxide peeling will be described here briefly with reference to FIGS. 1–3.

Figure 1:
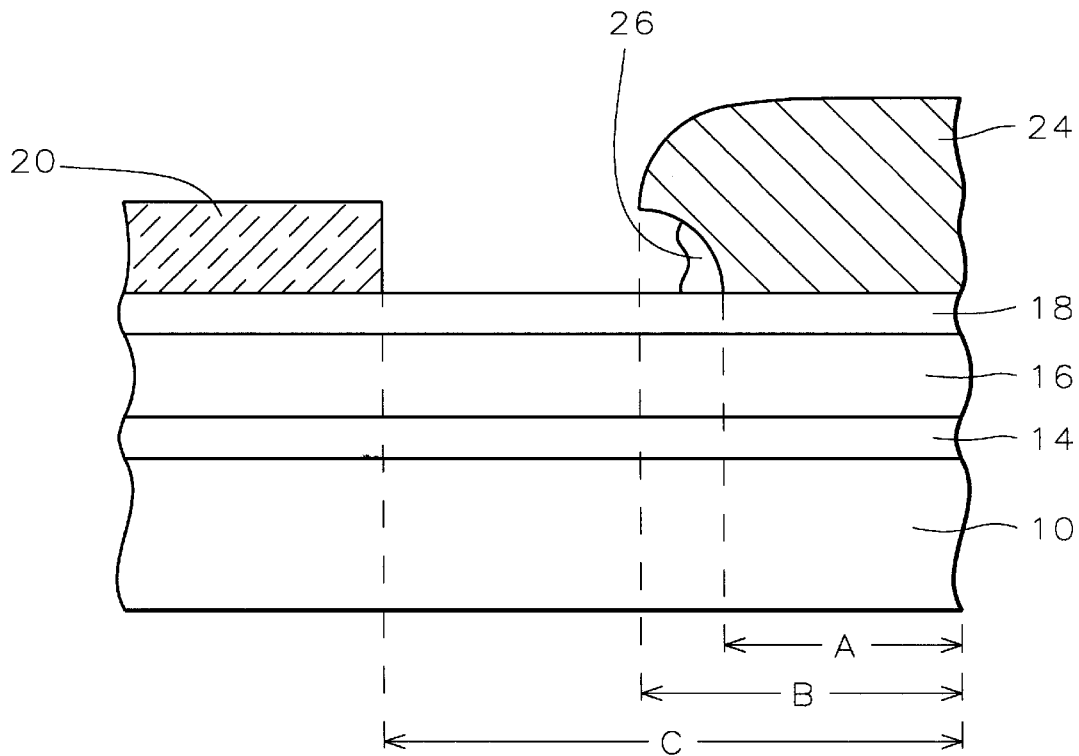
FIGS. 1 through 3 are cross-sectional representations of a preferred embodiment of a process of the prior art.

Referring now more particularly to FIG. 1, there is shown a wafer edge portion of a partially completed integrated circuit. The semiconductor substrate 10 is preferably composed of monocrystalline silicon in which may be formed semiconductor device structures which may include gate electrodes and source and drain regions and a first level of metallization, not shown.

Intermetal dielectric layers are deposited to fill gaps in the first metallization, not shown. For example, a first dielectric layer 14 of plasma-enhanced oxide (PEOX) is deposited to a thickness of about 2000 Angstroms, followed by depositing a gap-filling layer of oxide 16 by subatmospheric pressure chemical vapor deposition (SACVD) to a thickness of about 5000 Angstroms.

A spin-on-glass sandwich planarizing intermetal dielectric layer is formed over the top surface of the SACVD oxide layer 16. A conformal layer of silicon oxide 18, such as PEOX, is deposited to a thickness of about 2000 Angstroms. This is the first layer of the dielectric sandwich layer.

Now a silicate or siloxane spin-on-glass coating 20 is applied to a thickness of about 6000 Angstroms. The spin-on-glass layer is rinsed, baked and cured, as is conventional.

The spin-on-glass layer 20 is now to be etched back to planarize the dielectric layer. A clamp 24 holds the wafer in place at its edge. The spin-on-glass layer is etched back. During etchback, a polymer 26 is formed and builds up on the wafer surface underlying the clamp 24. Conventionally, the clamp holds the wafer to the distance A, about 1.5 mm from the edge of the wafer. The polymer buildup occurs at B, from 1.5 to 2.25 mm from the edge of the wafer. The spin-on-glass layer is rinsed back to distance C, about 3 mm from the edge of the wafer.

The polymer 26 remains on the surface of the wafer after the clamp is removed. The polymer 26 cannot be removed by conventional plasma treatment. Removing the polymer by using a wet photoresist strip will cause the spin-on-glass layer to absorb water from the wet strip which will cause reliability problems.

Figure 2:
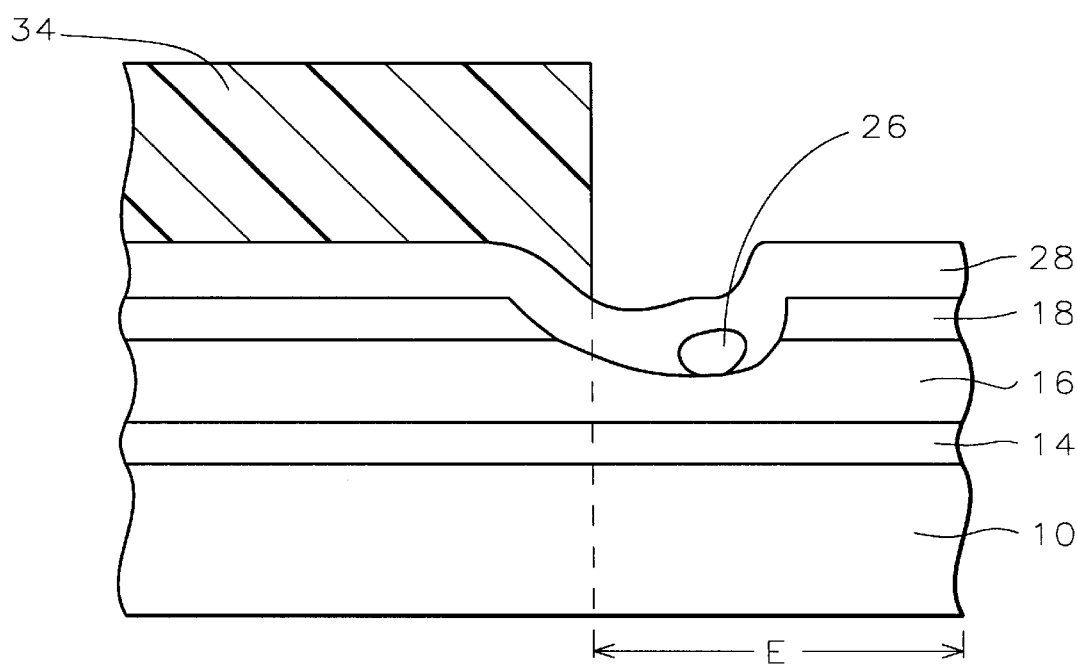

Finally, the top layer of the spin-on-glass sandwich is deposited. A second layer 28 of PEOX, or the like, is deposited over the etched back spin-on-glass layer to a thickness of about 3000 Angstroms completing the dielectric sandwich layer, as illustrated in FIG. 2. The spin-on-glass layer remaining is not shown in this edge portion of the wafer. The polymer buildup 26 is covered by the top dielectric layer 28.

In order to avoid peeling of the oxide layer 28, the co-pending invention employs an edge exclusion zone of the photoresist mask of greater than the distance E, which is about 2.25 mm from the edge of the wafer.

Figure 3:
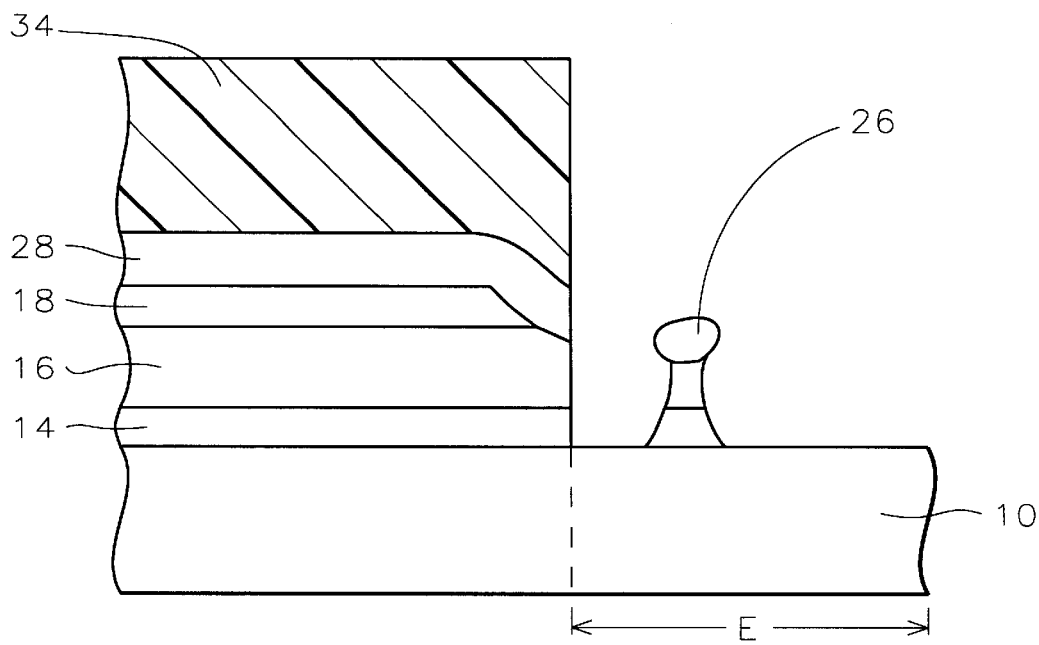

Referring to FIG. 3, the intermetal dielectric layer is etched through. The polymer 26 remains, but the oxide layer 28 overlying the polymer 26 is etched away since the photoresist mask does not cover the area of the polymer.

The photoresist strip step also removes the persistent polymer buildup 26. The wet PR strip can be used at this point because only a small portion of the spin-on-glass within the via opening is vulnerable to absorbing water from the wet strip. A vacuum bake will be performed next to remove the water from the spin-on-glass layer.

The increased edge exclusion zone allows for the persistent polymer to be removed, thus preventing oxide peeling and particle contamination. However, if the wafer transfer system shifted at the spin-on-glass etchback step, illustrated in FIG. 1, or if the edge exclusion zone shifted at the via photolithography step, illustrated in FIG. 2, the oxide layer above the persistent polymer would not be removed by the via etch step. If this happens, the polymer would remain under the oxide layer causing oxide peeling.

The process of the present invention provides a method for calibrating the wafer transfer system to assure that a shift has not occurred. The present invention utilizes an inspection control wafer to calibrate the wafer transfer system.

Figure 4:
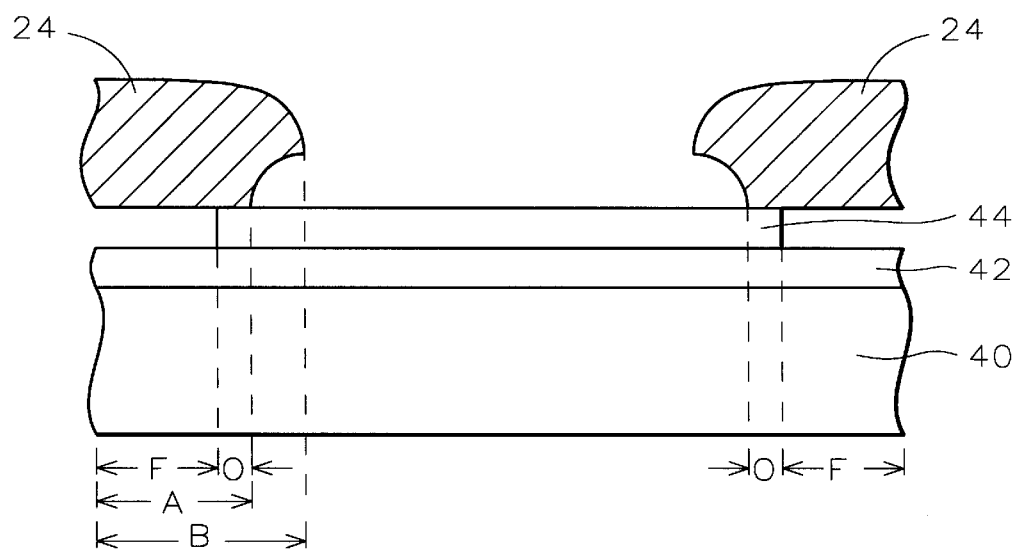
FIGS. 4 through 6 are cross-sectional representations of a preferred embodiment of the present invention.

Referring now to FIG. 4, the structure of the calibrated inspection control wafer is illustrated. The semiconductor substrate 40 is preferably composed of monocrystalline silicon. A layer of thermal oxide 42 is grown on the surface of the substrate to a thickness of about 5000 Angstroms. Next, a layer of doped polysilicon 44 is deposited over the oxide layer to a thickness of about 3000 Angstroms.

The polysilicon layer 44 is patterned to expose the surface of the thermal oxide layer 42 for a distance F of about 1.25 mm from the edge of the wafer. This distance F from the edge of the wafer is less than the distance A at which the clamp 24 holds the wafer. The distance O is the overlap between the distances F and A, about 0.25 mm. This is the alignment range of the clamps. If the clamp distance A is within the overlap difference O, no damage will occut to the oxide layer. The distance B is the area in which the polymer buildup will occur in the actual wafer, from 1.5 to 2.25 mm from the edge of the wafer.

The inspection control wafer is then run through the spin-on-glass etchback step. After the etchback, the control wafer is inspected. If the wafer transfer system is correctly calibrated, the clamps 24 will line up as shown in FIG. 4 and the thermal oxide layer 42 will be intact.

Figure 5:
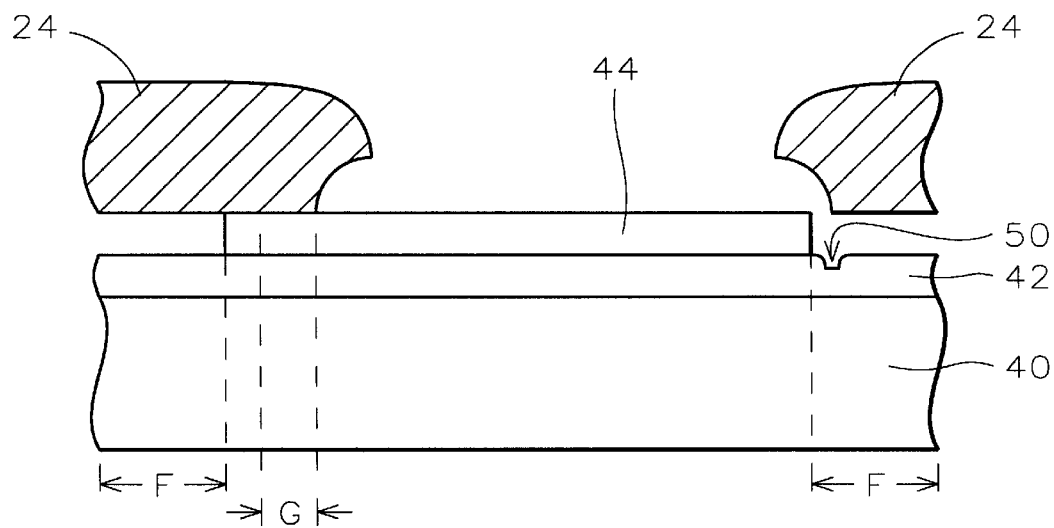

However, if the wafer transfer system is shifted, the results of this can be seen in the control wafer. FIG. 5 illustrates a transfer shift of more than about 0.25 mm. That is, the clamps 24 are shifted by the distance G or more than about 0.25 mm. This distance G is more than the overlap difference O between distances A and F. The shift may be to the right, as illustrated, or to the left. With this much of a shift, the oxide layer 42 is damaged at 50 where it is not shielded by the polysilicon layer 44. The oxide damage will show the need to recalibrate the wafer transfer system.

Figure 6:
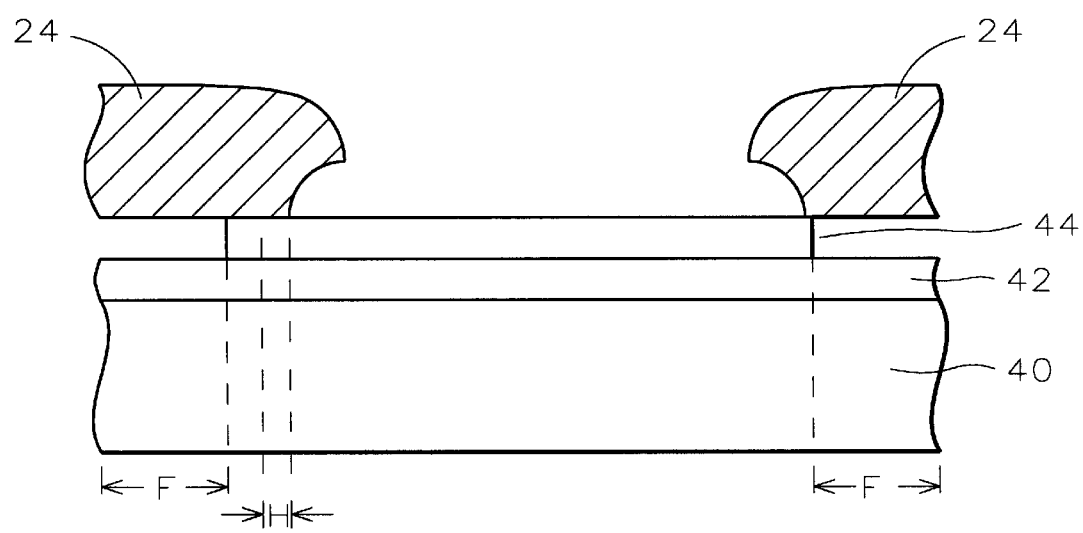

FIG. 6 illustrates a transfer shift of less than 0.25 mm. That is, the clamps 24 are shifted by the distance H or less than about 0.25 mm. This distance H is less than the overlap difference O between distances A and F. With a shift of less than 0.25 mm, the polysilicon layer 44 still shields the oxide layer 42 from damage during the spin-on-glass etchback step. This shows that in the real wafer, the oxide layer over the polymer will be removed during the subsequent via etch step.

The process of the present invention provides for a reliable and very manufacturable method of avoiding oxide peeling and particle contamination by assuring that the via wafer edge exclusion zone is properly adjusted so that polymer buildup remaining after spin-on-glass etchback can be removed by a wet strip after via etching. An inspection control wafer is used to calibrate the wafer transfer system. The wafer transfer system can be recalibrated as shown necessary by the inspection control wafer so that oxide peeling is prevented.

While the invention has been particularly shown and described with reference to the preferred embodiments thereof, it will be understood by those skilled in the art that various changes in form and details may be made without departing from the spirit and scope of the invention.

What is claimed is:

1. A method of calibrating a wafer transfer system in the fabrication of an integrated circuit device comprising:

providing an inspection control wafer comprising a polysilicon layer overlying an oxide layer on the surface of a semiconductor substrate wherein said polysilicon layer does not cover said oxide layer for a first distance from the edge of said wafer;

entering said inspection control wafer into said wafer transfer system wherein said wafer is transferred to a spin-on-glass etchback chamber wherein said wafer is held by clamps wherein said clamps extend a second distance from the edge of said wafer and wherein there is an overlap difference between said first and second distances;

subjecting said wafer to a spin-on-glass etchback step; and inspecting said wafer for damage to said oxide layer wherein oxide layer damage occurs if said second distance is less than said first distance by more than said overlap difference and wherein oxide layer damage indicates the need to recalibrate said wafer transfer system.

2. The method according to claim 1 wherein said oxide layer has a thickness of about 5000 Angstroms.

3. The method according to claim 1 wherein said polysilicon layer has a thickness of about 3000 Angstroms.

4. The method according to claim 1 wherein said first distance is about 1.25 mm.

5. The method according to claim 1 wherein said second distance is between about 1.5 and 2.25 mm.

6. The method according to claim 1 wherein said overlap distance is about 0.25 mm.

7. The method according to claim 1 wherein said oxide damage occurs if said second distance is less than said first distance by more than about 0.25 mm.

8. The method according to claim 1 wherein said oxide damage does not occur if said second distance is less than said first distance by less than about 0.25 mm.

9. A method of calibrating a wafer transfer system in the fabrication of an integrated circuit device comprising:

providing an inspection control wafer comprising:

growing an oxide layer on the surface of a semiconductor substrate; and depositing a polysilicon layer overlying said oxide layer wherein said polysilicon layer does not cover said oxide layer for a first distance from the edge of said wafer;

entering said inspection control wafer into said wafer transfer system wherein said wafer is transferred to a spin-on-glass etchback chamber wherein said wafer is held by clamps wherein said clamps extend a second distance from the edge of said wafer;

subjecting said wafer to a spin-on-glass etchback step; and inspecting said wafer for damage to said oxide layer wherein oxide layer damage occurs if said second distance is less than said first distance and wherein oxide layer damage indicates the need to recalibrate said wafer transfer system.

10. The method according to claim 9 wherein said oxide layer has a thickness of about 5000 Angstroms.

11. The method according to claim 9 wherein said polysilicon layer has a thickness of about 3000 Angstroms.

12. The method according to claim 9 wherein said first distance is about 1.25 mm.

13. The method according to claim 9 wherein said second distance is between about 1.5 and 2.25 mm.

14. The method according to claim 9 wherein said oxide damage occurs if said second distance is less than said first distance by more than about 0.25 mm.

15. The method according to claim 9 wherein said oxide damage does not occur if said second distance is less than said first distance by less than about 0.25 mm.

16. A method of calibrating a wafer transfer system in the fabrication of an integrated circuit device comprising:

providing an inspection control wafer comprising:
    growing an oxide layer on the surface of a semiconductor substrate; and
    depositing a polysilicon layer overlying said oxide layer wherein said polysilicon layer does not cover said oxide layer for a first distance from the edge of said wafer;

entering said inspection control wafer into said wafer transfer system wherein said wafer is transferred to a spin-on-glass etchback chamber wherein said wafer is held by clamps wherein said clamps extend a second distance from the edge of said wafer;

subjecting said wafer to a spin-on-glass etchback step; and inspecting said wafer for damage to said oxide layer wherein oxide layer damage occurs if said second distance is less than said first distance by a difference of more than 0.25 mm and wherein oxide layer damage indicates the need to recalibrate said wafer transfer system.

17. The method according to claim 16 wherein said oxide layer has a thickness of about 5000 Angstroms.

18. The method according to claim 16 wherein said polysilicon layer has a thickness of about 3000 Angstroms.

19. The method according to claim 16 wherein said first distance is about 1.25 mm.

20. The method according to claim 16 wherein said second distance is between about 1.5 and 2.25 mm.

* * * * *